United States Patent
Lai et al.

(10) Patent No.: US 12,191,224 B2
(45) Date of Patent: *Jan. 7, 2025

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Wei-Chih Lai, Hsinchu (TW); Chien-Chia Chiu, Taoyuan (TW); Chen-Hua Yu, Hsinchu (TW); Der-Chyang Yeh, Hsin-Chu (TW); Cheng-Hsien Hsieh, Kaohsiung (TW); Li-Han Hsu, Hsin-Chu (TW); Tsung-Shu Lin, New Taipei (TW); Wei-Cheng Wu, Hsinchu (TW); Yu-Chen Hsu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/981,465

(22) Filed: Nov. 6, 2022

(65) Prior Publication Data
US 2023/0054020 A1 Feb. 23, 2023

Related U.S. Application Data

(63) Continuation of application No. 16/835,322, filed on Mar. 31, 2020, now Pat. No. 11,515,229.

(51) Int. Cl.
*H01L 23/367* (2006.01)
*H01L 21/52* (2006.01)
(Continued)

(52) U.S. Cl.
CPC .......... *H01L 23/3675* (2013.01); *H01L 21/52* (2013.01); *H01L 21/563* (2013.01); *H01L 23/3128* (2013.01); *H01L 23/49816* (2013.01); *H01L 23/5383* (2013.01); *H01L 25/0655* (2013.01); *H01L 25/50* (2013.01)

(58) Field of Classification Search
CPC ............... H01L 23/3675; H01L 21/563; H01L 23/3128; H01L 23/49816; H01L 25/0655; H01L 25/50
See application file for complete search history.

(56) References Cited

U.S. PATENT DOCUMENTS 9,000,584 B2   4/2015   Lin et al.
9,048,222 B2   6/2015   Hung et al.
(Continued)

*Primary Examiner* — Phat X Cao
(74) *Attorney, Agent, or Firm* — JCIPRNET

(57) ABSTRACT

A semiconductor package includes a circuit substrate, a die, a frame structure, and a heat sink lid. The die is disposed on the circuit substrate and electrically connected with the circuit substrate. The die includes two first dies disposed side by side and separate from each other with a gap between two facing sidewalls of the two first dies. The frame structure is disposed on the circuit substrate and surrounding the die. The heat sink lid is disposed on the die and the frame structure. The head sink lid has a slit that penetrates through the heat sink lid in a thickness direction and exposes the gap between the two facing sidewalls of the two first dies.

20 Claims, 12 Drawing Sheets

(51) Int. Cl.
  *H01L 21/56* (2006.01)
  *H01L 23/31* (2006.01)
  *H01L 23/498* (2006.01)
  *H01L 23/538* (2006.01)
  *H01L 25/00* (2006.01)
  *H01L 25/065* (2023.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,515,229 B2 * | 11/2022 | Lai .................. H01L 25/50 |
| 2012/0182694 A1 * | 7/2012 | Lin .................. H01L 23/16 |
| | | 361/728 |
| 2017/0162542 A1 * | 6/2017 | Chen .................. H01L 21/56 |

* cited by examiner

SEMICONDUCTOR PACKAGE AND MANUFACTURING METHOD THEREOF

CROSS-REFERENCE TO RELATED APPLICATION

This application is a continuation application of and claims the priority benefit of U.S. patent application Ser. No. 16/835,322, filed on Mar. 31, 2020, which is allowed. The entirety of the above-mentioned patent application is hereby incorporated by reference herein and made a part of this specification.

BACKGROUND

As electronic products are continuously miniaturized, heat dissipation has become an important issue for packaging technology. For multi-die packages, the choices and the arrangement of the packaging materials relative to the packaged semiconductor dies have become an important issue for packaging technology and have impacts on reliability of the packaged products.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
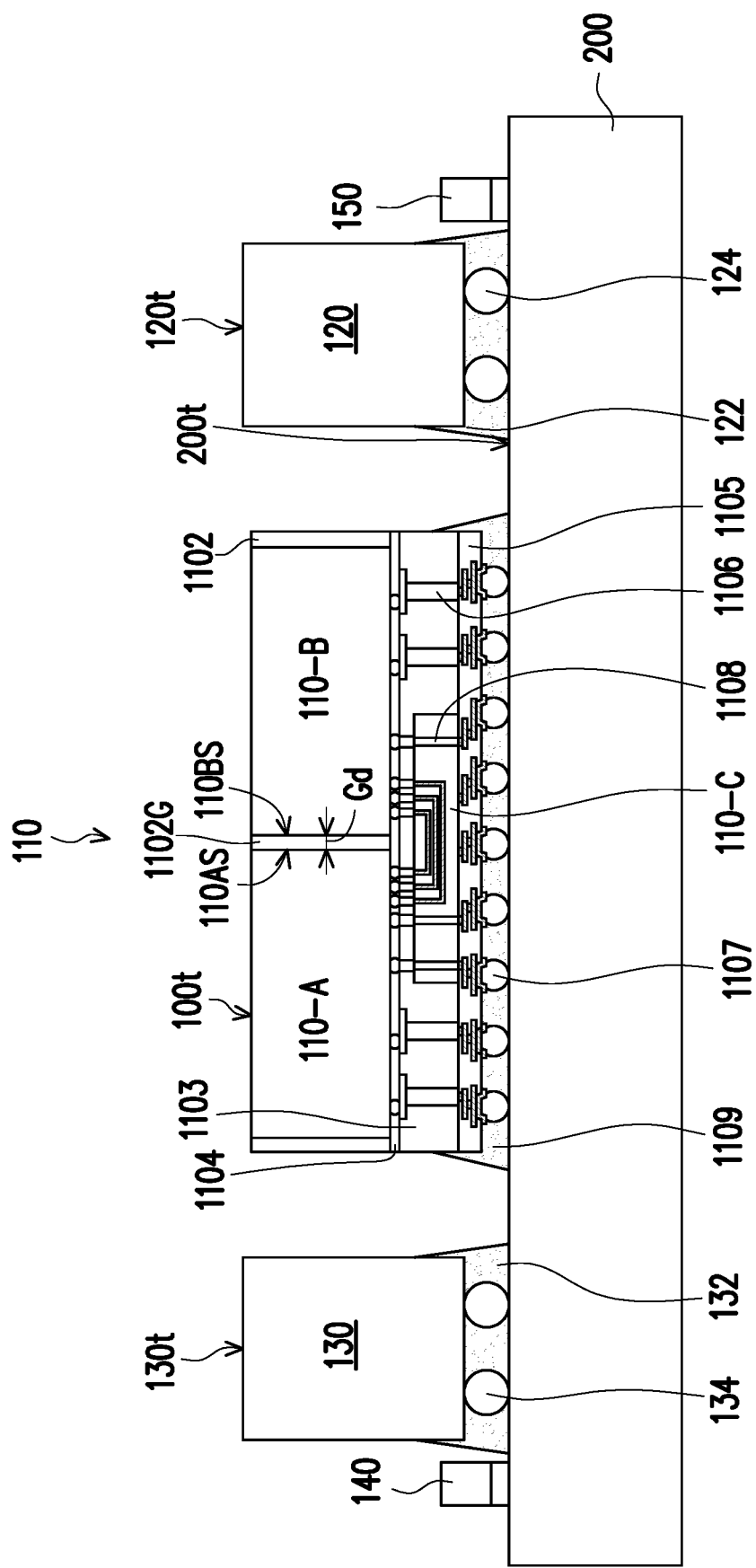
FIG. 1 through FIG. 6 are schematic cross-sectional views and top views illustrating the structures formed at various stages of a manufacturing method of a semiconductor package according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 6 are schematic cross-sectional views and top views illustrating the structures formed at various stages of a manufacturing method of a semiconductor package according to some embodiments of the present disclosure. The exemplary semiconductor package structure as shown from FIG. 1 to FIG. 6 is mounted on and connected to a circuit substrate. The cross-section views shown in FIGS. 1-2 and 4-5 are the sectional views following the cross-line I-I' shown in FIG. 3 and FIG. 6.

Referring to FIG. 1, in some embodiments, a circuit substrate 200 is provided. In some embodiments, the circuit substrate 200 includes a printed circuit board, a laminated board or a flexible laminate board. In some embodiments, the circuit substrate 200 includes one or more active components, passive components, or a combination thereof. In some embodiments, the circuit substrate 200 may also include metallization layers (not shown), though vias (not shown), and bond pads (not shown) connected to the metallization layers and the vias to provide, for example, dual-side electrical connection. The metallization layers may be formed over the active components and passive components, and may be designed to connect the various components to form functional circuitry. In FIG. 1, semiconductor dies 110, 120, 130 are provided and mounted to the top surface 200t of the circuit substrate 200. Also, passive components 140, 150 are provided and mounted to the top surface 200t of the circuit substrate 200. For example, the dies 110, 120, 130 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the dies 110, 120, 130 may independently be or include a memory die, such as a dynamic random access memory (DRAM) die, a static random access memory (SRAM) die or a high bandwidth memory (HBM) die. In some embodiments, the semiconductor dies 120, 130 may be the same type of dies or perform the same functions. In some embodiments, the semiconductor dies 110, 120, 130 may be different types of dies or perform different functions. In certain embodiments, the semiconductor die 110 includes multiple dies, and the semiconductor dies 120 and 130 include memory dies.

Referring to FIG. 1, in some embodiments, the die 110 includes multiple semiconductor dies 110-A, 110-B laterally wrapped by a first encapsulant 1102, a semiconductor die 110-C connected with the dies 110-A and 110-B, and a second encapsulant 1103 encapsulating the semiconductor die 110-C. In FIG. 1, the dies 110-A and 110-B are disposed side by side and are separate from each other, and the first encapsulant 1102 wraps around the sidewalls of the dies 110-A and 110-B. In some embodiments, the two facing sidewalls 110AS and 110BS of the dies 110-A and 110-B are spaced apart from each other with a gap Gd that is filled up by the first encapsulant 1102. That is, a portion 1102G of the first encapsulant 1102 is located between the adjacent sidewalls 110AS, 110BS of the dies 110-A and 110-B and fills the gap Gd between the dies 110-A and 110-B. The contacts of the semiconductor dies 110-A, 110-B are connected with the contacts of the semiconductor die 110-C, and the semiconductor die 110-C that includes through semiconductor vias (TSVs) 1108 and internal wirings functions as a bridge structure or local interconnection structure electrically interconnecting the dies 110-A and 110-B. In some embodiments, the dies 110-A, 110-B include active devices therein. In one embodiment, the die 110-A or 110-B is independently a logic die, an input-output (I/O) die, or an application processor (AP) die. In some embodiments, the die 110-C does not include active devices therein and functions as a local interconnection structure. In some embodiments, a redistribution layer 1104 is disposed between the first encapsulant 1102 and the second encapsulant 1103 and between active surfaces (i.e. lower surfaces in FIG. 1) of the dies 110-A and 110-B and the die 110-C. That is, the dies 110-A and 110-B communicate with each other through the die 110-C. In some embodiments, the die 110 further includes through insulator vias (TIVs) 1106 penetrating through the second encapsulant 1103, and a redistribution layer 1105 disposed over the second encapsulant 1103 and on the semiconductor die 110-C. The TIVs 1106 are physically and electrically connected with the redistribution layers 1104 and 1105. In some embodiments, the die 110 also includes a plurality of connective terminals 1107 located on and electrically connected with the redistribution layer 1105.

In FIG. 1, the die 110 is mounted on the circuit substrate 200 and is electrically connected with the circuit substrate 200 though the connective terminals 1107. In some embodiments, a first underfill 1109 is formed between the bottom surface of the die 110 and the circuit substrate 200 and filling the spaces among the connective terminals 1107. For example, the connective terminals 1107 are controlled collapse chip connection (C4) bumps, micro bumps, metal pillars or combination thereof (e.g., a metal pillar with a solder ball attached thereon), or the like. In some embodiments, the underfill 1109 is formed by capillary underfill filling (CUF). In some embodiments, a curing process may be performed to consolidate the underfill 1109. In some embodiments, the material of the TSVs 1108 or the TIVs 1106 includes copper, copper alloys or other suitable metallic materials. In one embodiment, the material of the first or second encapsulant includes epoxy resins, phenolic resins or the like. In one embodiment, the material of the first encapsulant 1102 is different from the material of the second encapsulant 1103. In one embodiment, the material of the first encapsulant 1102 is substantially the same as the material of the second encapsulant 1103.

Referring to FIG. 1, in some embodiments, the semiconductor dies 120 and 130 are memory dies having stacks of multiple memory chips. The dies 120, 130 are mounted on the top surface 200t of the circuit substrate 200 and are spaced apart with gaps G3 (see FIG. 3) in-between. The dies 120, 130 are electrically connected with the circuit substrate 200 through the connectors 124, 134. In some embodiments, a second underfill 122 and a third underfill 132 are respectively formed between the circuit substrate 200 and the bottom surface of the die 120 or 130 and filling the spaces among the connectors 124, 134. In some embodiments, the underfill 122 or 132 is formed by capillary underfill filling (CUF). In some embodiments, a curing process may be performed to consolidate the underfill 122 or 132. In FIG. 1, the passive components 140, 150 are provided and bonded to the circuit substrate 200. In some embodiments, the passive components 140, 150 include integrated passive devices (IPDs) such as resistors, capacitors, inductors, or the like formed in semiconductor substrates. For example, the passive components 140, 150 are bonded to the circuit substrate 200 through soldering. The semiconductor dies 110, 120, 130 and the passive components 140, 150 are mounted to the circuit substrate through the pick and place method, and any of the dies 110, 120, 130 may be mounted before or after bonding the passive components to the circuit substrate 200.

Figure 2:
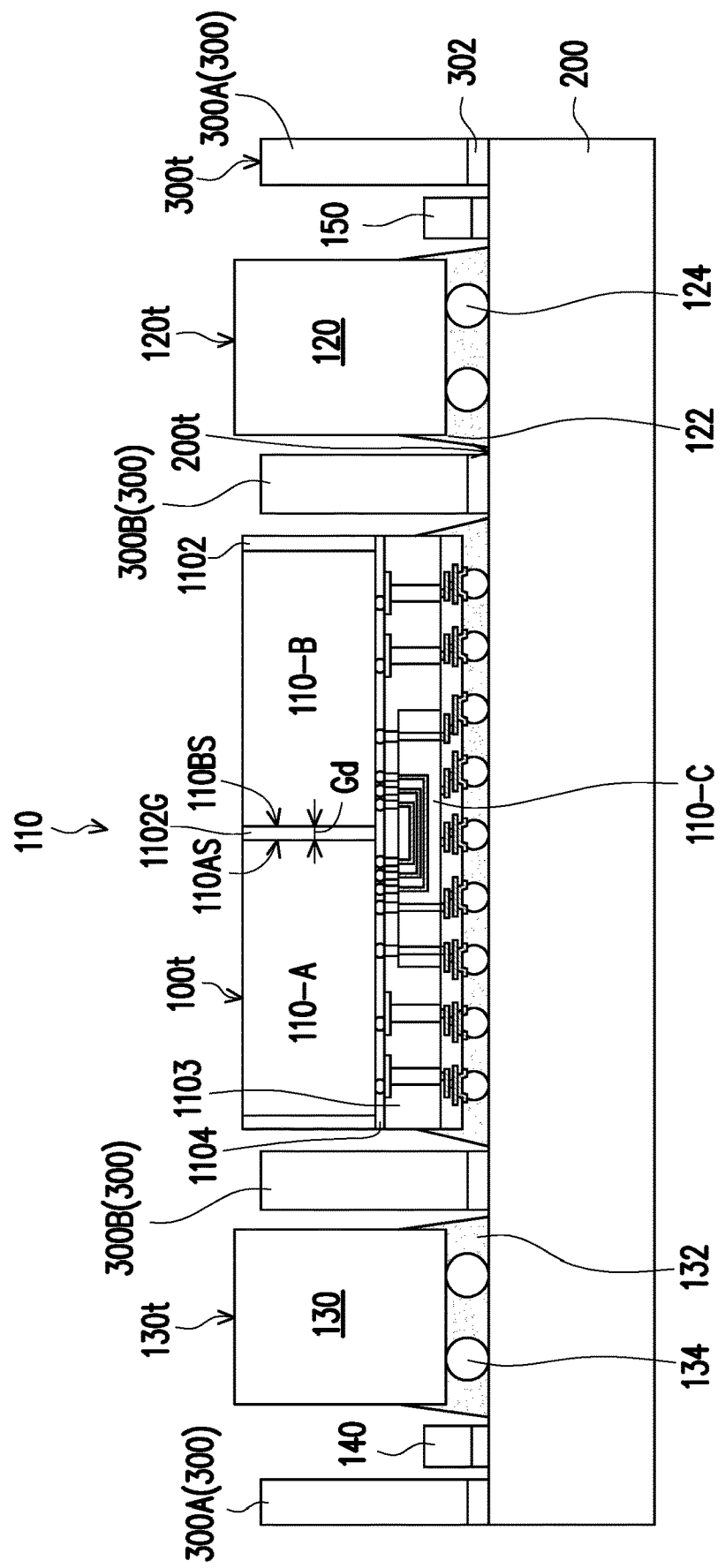
Figure 3:
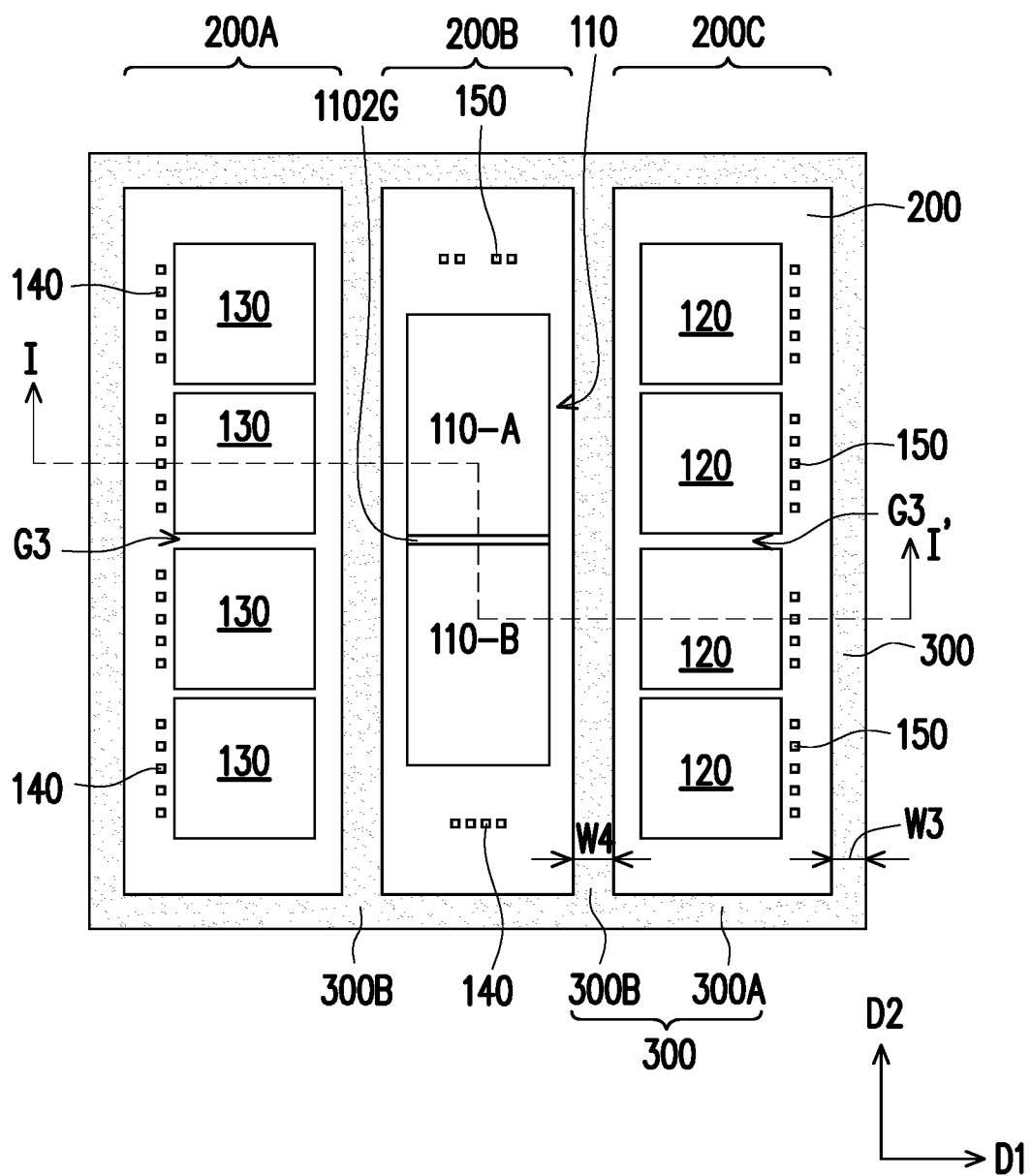

In FIG. 2, a frame structure 300 is provided and mounted to the circuit substrate 200. In some embodiments, the frame structure 300 is attached to the circuit substrate 200 through an adhesive material 302. For example, the adhesive material 302 includes a thermo-curable adhesive, a photocurable adhesive, a thermally conductive adhesive, a thermosetting resin, a lamination adhesive or a combination thereof. In some embodiments, the adhesive material 302 includes a thermally conductive adhesive. In some embodiments, referring to FIG. 3, it is seen that the frame structure 300 is a wall-like structure enclosing empty space therein, and the frame structure 300 includes a ring portion 300A surrounding the dies 110, 120, 130 and beam portions 300B extending in the direction D2 and connected with the ring portion 300A. In one embodiment, the width W3 of the ring portion 300A and the width W4 of the beam portions 300B are about the same and range from about 1.5 mm to about 3 mm. In embodiments, both ends of the beam portions 300B are connected to the two opposite sides of the ring portion 300A, dividing into three regions 200A, 200B and 200C. From the top view of FIG. 3, the die 110 is arranged in the central region 200B, while the dies 120, 130 are arranged in the outer regions 200C, 200A and are spaced apart from each other with gaps G3 in-between. In some embodiments, the passive components 140, 150 are located beside the dies 110, 120, 130 in three regions 200A, 200B and 200C. In some embodiments, as seen in FIG. 3, the provided die 110 has a rectangular shape and the dies 110-A and 110-B also have rectangular shapes. From the top view of FIG. 3, the portion 1102G of the first encapsulant 1102 located between the short sides of the dies 110-A and 110-B is exposed. In some embodiments, the frame structure 300 is made of a thermally conductive material. The frame structure 300 mainly functions as the support. In some embodiments, the frame structure 300 is electrically isolated from (not electrically connected with) the circuit substrate 200 when the adhesive 302 does not include an electrically conductive adhesive. In some embodiments, the frame structure 300 may be electrically connected with the circuit substrate 200 and further function as a shielding structure (e.g. EMI shielding) when the adhesive 302 includes an electrically conductive adhesive. In some embodiments, the material of the frame structure 300 includes a metal or metallic material such as a stainless steel. For example, the frame structure 300 is prefabricated by wire-cut, stamping or compression. In some embodiments, the circuit substrate 200 has an area substantially equivalent to the spreading span (or the enclosure) of the frame structure 300. In one embodiment, the circuit substrate 200 has a length of about 55-75 mm and a width of about 50-70 mm. In some embodiments, the frame structure 300 in FIG. 2 has a height lower than the thickness of the dies 110, 120, 130. That is, the top surface 300t of the frame structure 300 is lower than the top surfaces 110t, 120t, 130t of the dies 110, 120, 130. However, it is understood that the height of the frame structure 300 may be adjusted based on the thickness of the dies 110, 120, 130 or the product design.

Figure 4:
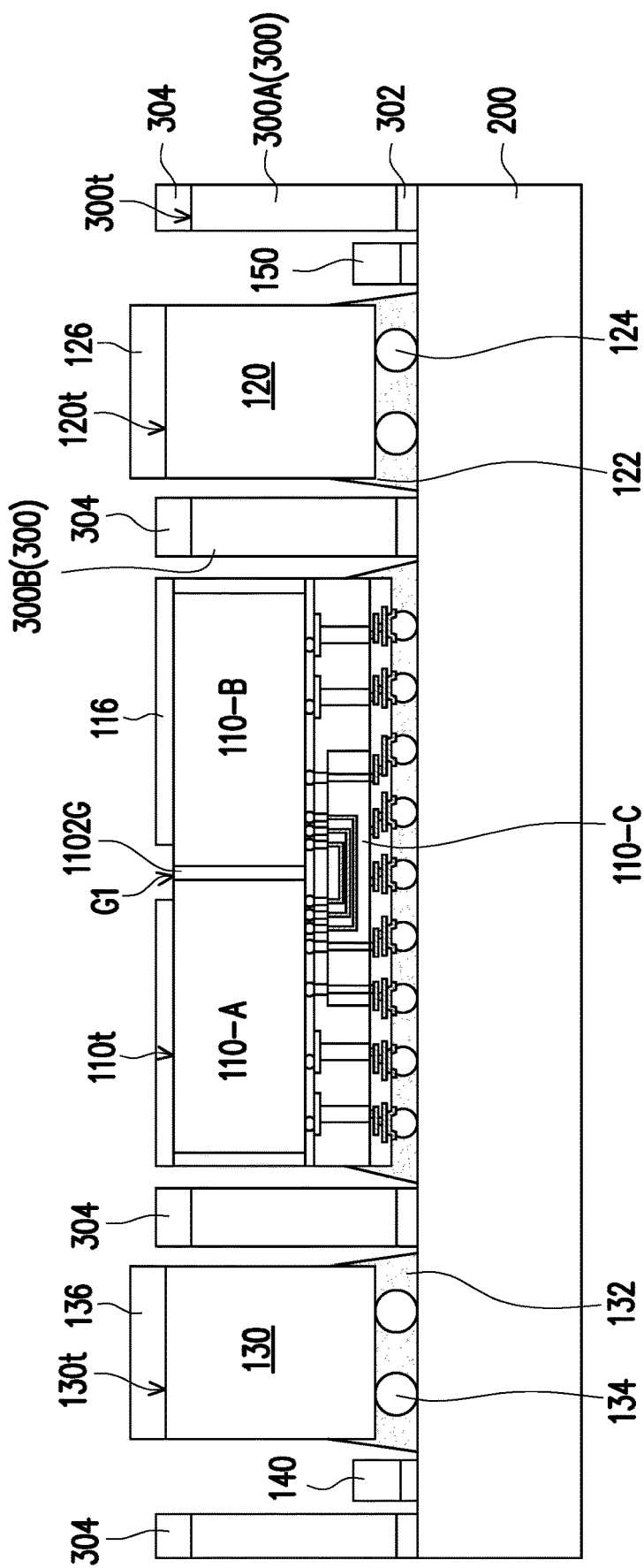

Referring to FIG. 4, an adhesive 304 is formed on the top surface 300t of the frame structure 300, and adhesives 126, 136 are formed on the top surfaces 120t, 130t of the dies 120, 130. For example, the material of the adhesives 126, 136, 304 includes a thermo-curable adhesive, a photocurable adhesive, a thermally conductive adhesive, a thermosetting resin or a combination thereof. According to the type of material used, the adhesives 126, 136, 304 may be formed by deposition, lamination, printing, plating, or any other suitable technique. In addition, a binding material 116 is formed on the top surface 110t of the die 110. In some embodiments, the spreading span of the binding material 116 correspond to the shape of the subsequently applied heat sink lid. In some embodiments, the binding material 116 is formed as two separate pieces located on the top surface 110t of the die 110 with a gap G1 in-between. For example, the material of the binding material 116 includes a solder paste or tin alloy paste. In some embodiments, the bonding material 116 is applied to the die 110 through a printing step, for example via stencil printing. In some embodiments, no adhesive material or bonding material is applied to the tops of the passive components 140, 150 located beside the dies 110, 120, 130 as the passive components 140, 150 are smaller in sizes and have a much smaller thickness.

Figure 5:
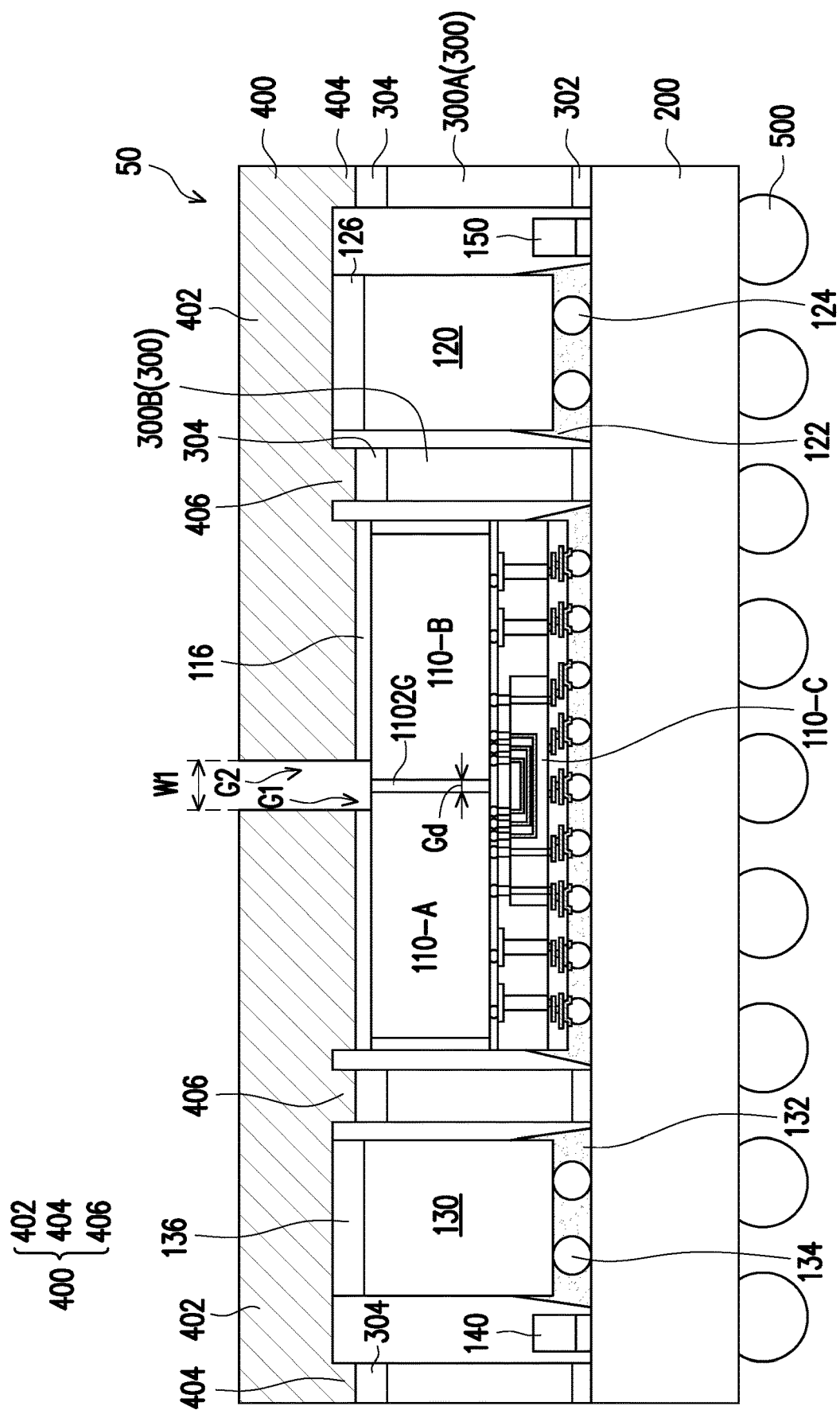
Figure 6:
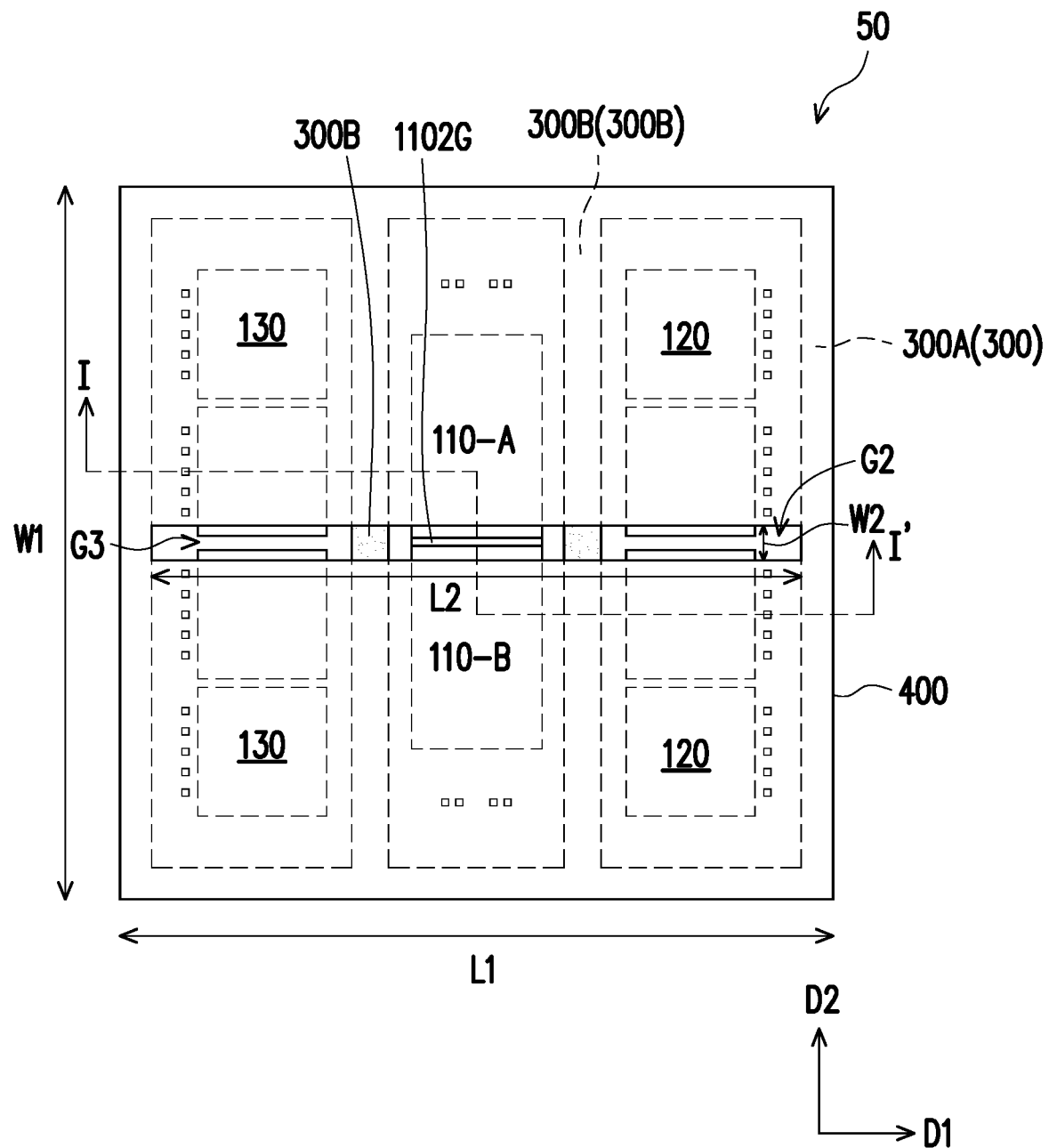

Referring to FIG. 5 and FIG. 6, a heat sink lid 400 is provided over the frame structure 300 and over the dies 110, 120, 130. In some embodiments, the provided heat sink lid 400 is of a size substantially equivalent to the size of the circuit substrate 200. In embodiments, in FIG. 5, the heat sink lid 400 includes a cap 402, ridge portions 406, and a rim 404 at the periphery of the cap 402 and surrounding the cap 402. In some embodiments, the cap 402 is disposed over the frame structure 300 and the dies 110, 120, 130 and extends substantially parallel to the circuit substrate 200. In some embodiments, the rim 404 is located at the edge of the cap 402, and projected toward the circuit substrate 200. In some embodiments, the rim 404 is projected out of the plane defined by the cap 402 and joined with the cap 402. In some embodiments, the ridge portions 406 extend in the direction D2 across the cap 402 and are located at locations corresponding to the beam portions 300B of the frame structure 300. In some embodiments, the ridge portions 406 are projected out of the plane defined by the cap 402 and joined with the cap 402. In some embodiments, the heat sink lid 400 including the cap 402, the rim 404 and the ridge portions 406 is an integral piece. That is, the cap 402, the rim 404 and the ridge portions 406 of the heat sink lid 400 may be fabricated as one single piece.

In some embodiments, conductive balls 500 are formed on the bottom surface of the circuit substrate 200. In some embodiments, the conductive balls 500 include ball grid array balls, solder balls or C4 bumps. In some embodiments, the conductive balls 500 are electrically connected with the circuit substrate 200 and some of the conductive balls 500 are electrically connected with the dies 110, 120 and/or the dies 130 through the circuit substrate 200.

In some embodiments, in FIG. 5, the heat sink lid 400 is attached to the frame structure 300 and in contact with the adhesives 304 on the frame structure 300. Also, the heat sink lid 400 is attached to the dies 110, 120, 130 and is in contact with the adhesives 126, 136 on the dies 120, 130 and in contact with the binding material 116 on the die 110. Hence, a semiconductor package 50 is produced. In some embodiments, the heat sink lid 400 has a through trench or slit G2 penetrating through (in the thickness direction) the heat sink lid 400. For example, the material of the heat sink lid 400 may include a metallic material such as copper or copper alloys, and the heat sink lid 400 may be prefabricated by wire-cut, stamping or compression. In some embodiments, before mounting and attaching the heat sink lid 400 to the frame structure, the position of the heat sink lid 400 is aligned vertically with the underlying frame structure 300, so that the rim 404 is attached to the ring portion 300A of the frame structure 300, the ridge portions 406 are attached to the beam portions 300B, and the cap 402 covers the spans of the dies 110, 120, 130. As shown in FIG. 6, the slit G2 extends in the first direction D1 (parallel to the extending direction of the gap G1 or Gd and perpendicular to the extending direction D2 of the beam portions 300B) across the beam portions 300B, and the slit G2 exposes the gap between the dies 110-A, 110B and the gaps G3 between the dies 130 and between the dies 120, as well as portions of the beam portions 300B.

In some embodiments, in FIG. 6, the extending length L2 of the slit G2 in the heat sink lid 400 is smaller than the full length L1 of the heat sink lid 400. That means the slit G2 does not separate the heat sink lid 400 into two pieces. In one embodiment, the slit G2 penetrates through the cap 402 in the direction D1. Referring to FIG. 5 and FIG. 6, in some embodiments, the location of the slit G2 is overlapped with the location of the gap G1 of the bonding material layer 116 and overlapped with the location of the gap Gd between the dies 110-A and 110-B. From FIG. 5 and the top view of FIG. 6, the slit G2 joining with the gap G1 exposes the underlying encapsulant portion 1102G (the first encapsulant 1102 located between the dies 110-A and 110-B). In some embodiments, the slit G2 has a width W2 substantially equivalent to the width of the gap G1 and larger than the width of the gap Gd between the dies 110-A and 110-B. In one embodiment, the width W2 ranges from about 0.4 mm to about 1.0 mm. In some embodiments, the length L2 of the slit G2 ranges from about 25 mm to about 57 mm, and the full length L1 of the heat sink lid 400 ranges from about 55 mm to about 65 mm. In one embodiment, the location of the slit G2 is at around half of the width W1 of the heat sink lid 400. The location of the slit G2 may be varied but corresponds to the location of the gap Gd between the dies 110-A and 110-B. In embodiments, the slit G2 is long or wide enough to expose the underlying encapsulant portion 1102G that is filled in the gap Gd between the dies 110-A and 110-B. Also, the location of the slit G2 may correspond to the location(s) of the gap(s) G3 between the dies 130 and/or the dies 120.

Through the application of the heat sink lid with slit(s), the stress due to CTE mismatch may be reduced, as the encapsulant portion 1102G is not covered by the heat sink lid 400 and less cracking or delamination caused by the stress occurs, leading to better reliability of the package structure 50 and higher production yield. In some embodiments, the above semiconductor packages 50 may be manufactured as large-scale Integrated Fan-Out (InFO) packages, with better reliability and yield but without an increase in manufacturing costs.

It is understood that only three semiconductor dies 110, 120, 130 are shown on the circuit substrate 200 in FIG. 1 for simplicity, but the disclosure is not limited thereto. In some embodiments, the semiconductor package 50 may include more or fewer semiconductor dies. Also, although only the passive components 140, 150 are shown in the above embodiment, it is understood that other components (e.g., interconnect structures, support structures, etc.) may be mounted or formed within the circuit substrate 200. Furthermore, whilst the process is currently being illustrated for large scale InFO packages or multi-die stacking packages, the disclosure is not limited to the package structures shown in the drawings, and other types of wafer level packages are also meant to be covered by the present disclosure and to fall within the scope of the appended claims.

Figure 7:
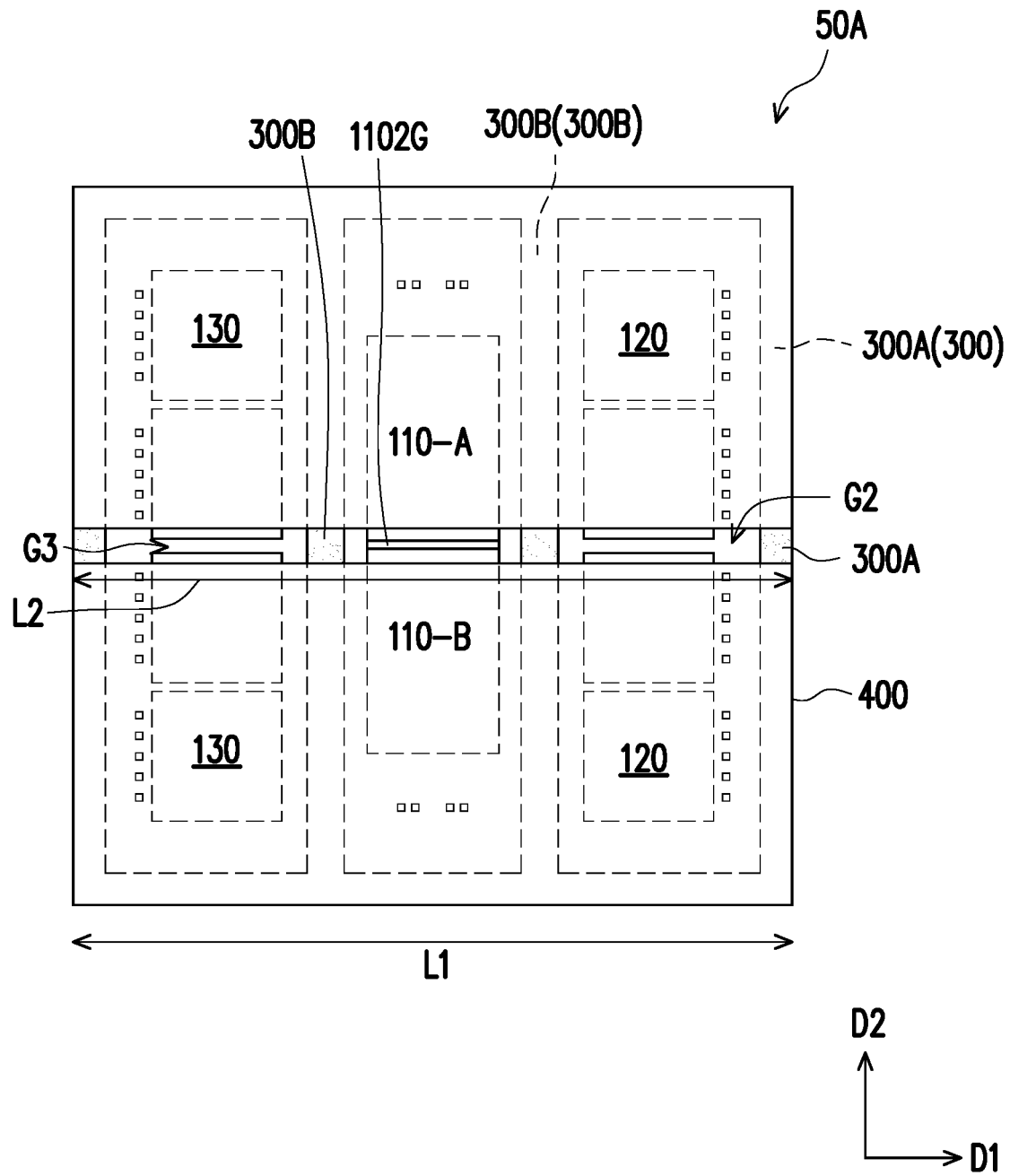
FIG. 7 is a schematic top view of a semiconductor package according to some embodiments of the present disclosure.

FIG. 7 is a schematic top view of a semiconductor package according to some embodiments of the present disclosure. The package structure 50A shown in FIG. 7 is similar to the package structure 50 as shown in FIG. 5 and FIG. 6, except for the design of the heat sink lid 400. The same or similar elements are labeled with the same reference numbers and shall not be described in details again for simplicity. In some embodiments, the heat sink lid 400 has a slit G2 extending through the whole length L1 of the heat sink lid 400. That is, for the package structure 50A, the extending length L2 of the slit G2 of the heat sink lid 400 is substantially equivalent to the full length L1 of the heat sink lid 400, and the slit G2 separates the heat sink lid 400 into two halves. For the design shown in FIG. 7, the two pieces of the heat sink lid 400 may be mounted to the underlying frame structure 300 in separate steps or in one step. Referring to FIG. 7, in some embodiments, the slit G2 extends in the first direction D1 (substantially perpendicular to the extending direction D2 of the beam portions 300B) across the ring portion 300A and beam portions 300B, and the slit G2 exposes the gap between the dies 110-A, 110B and the gaps G3 between the dies 130 and between the dies 120, as well as portions of the ring portion 300A and portions of the beam portions 300B.

Figure 8:
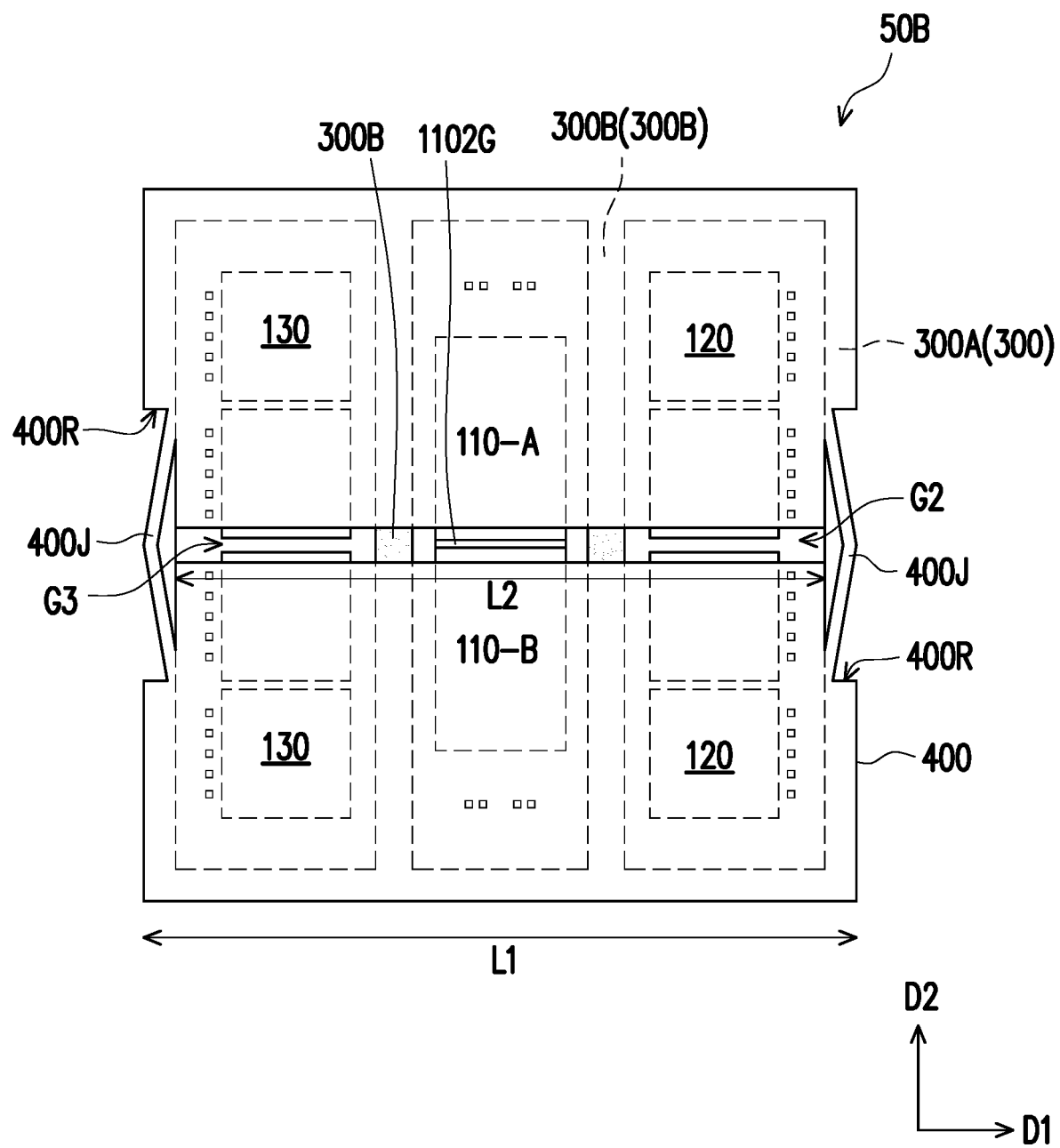
FIG. 8 is a schematic top view of a semiconductor package according to some embodiments of the present disclosure.

FIG. 8 is a schematic top view of a semiconductor package according to some embodiments of the present disclosure. The package structure 50B shown in FIG. 8 is similar to the package structure 50 as shown in FIG. 5 and FIG. 6, except for the design of the heat sink lid 400. In some embodiments, for the package structure 50B, the heat sink lid 400 has two recesses 400R at two opposite sides of the heat sink lid 400, and the heat sink lid 400 has a slit G2 extending from one recess 400R to the other recess 400R to separate the heat sink lid 400 into two pieces and divide each recess 400R into upper and lower portions. Although the extending length L2 of the slit G2 is smaller than the whole length L1 of the heat sink lid 400, the slit G2 separates the heat sink lid 400 into two pieces due to the design of the recesses 400R. The heat sink lid 400 includes two joint arms 400J located respectively in the two recesses 400R, and two ends of each joint arm 400J are respectively connected to the upper and lower portions of each recess 400R, so that the joint arms 400J connect the two pieces of the heat sink lid 400 together. By doing so, the two pieces of the heat sink lid 400 may be mounted to the underlying frame structure 300 in one step and the alignment of the heat sink lid 400 to the underlying frame structure 300 may be easier. Referring to FIG. 8, in some embodiments, the slit G2 extends in the first direction D1 (substantially perpendicular to the extending direction D2 of the beam portions 300B) across the beam portions 300B, and the slit G2 exposes the gap between the dies 110-A, 110B and the gaps G3 between the dies 130 and between the dies 120, as well as portions of the beam portions 300B.

Figure 9:
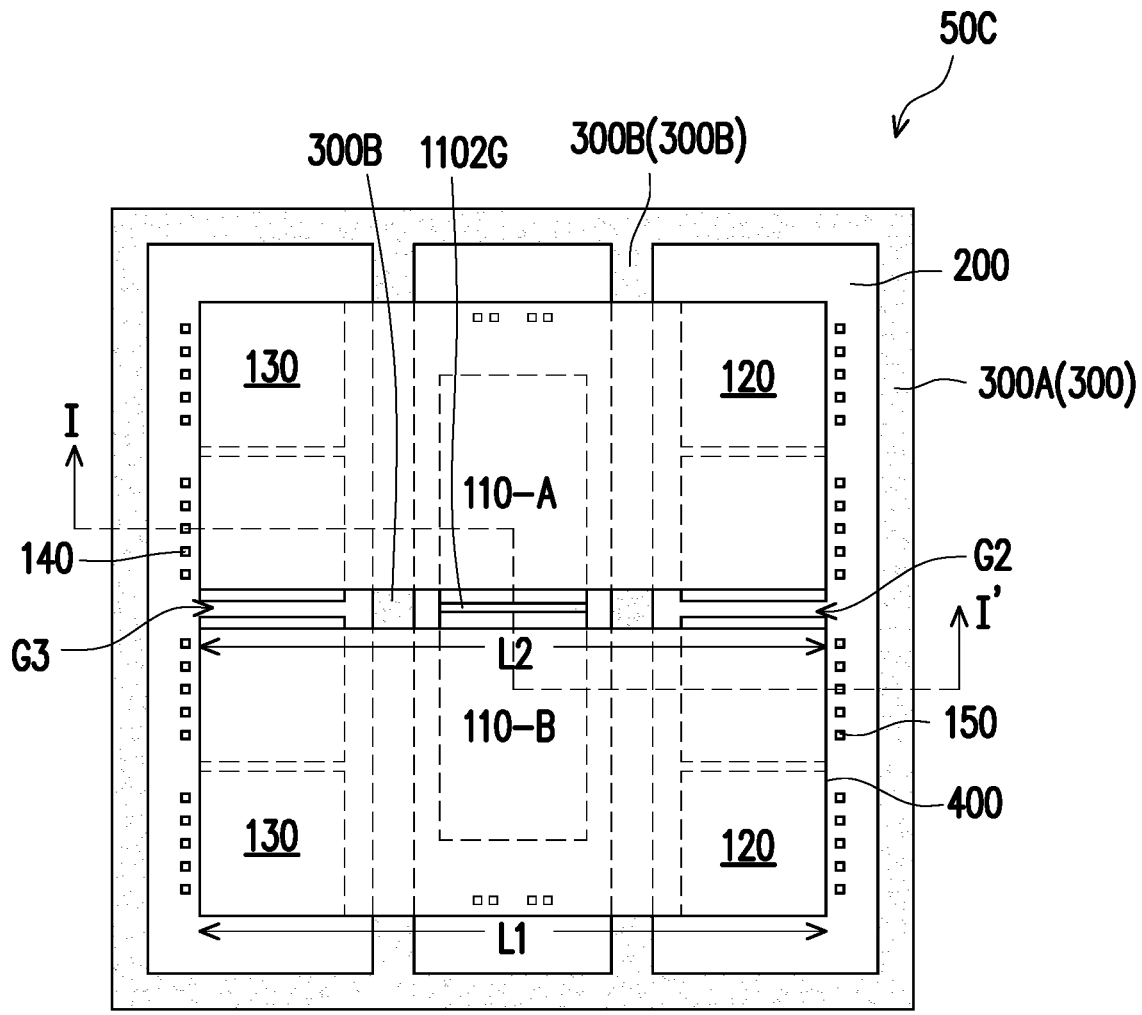
FIG. 9 and FIG. 10 respectively illustrates a schematic top view and a schematic cross-sectional view of a semiconductor package according to some embodiments of the present disclosure.
Figure 10:
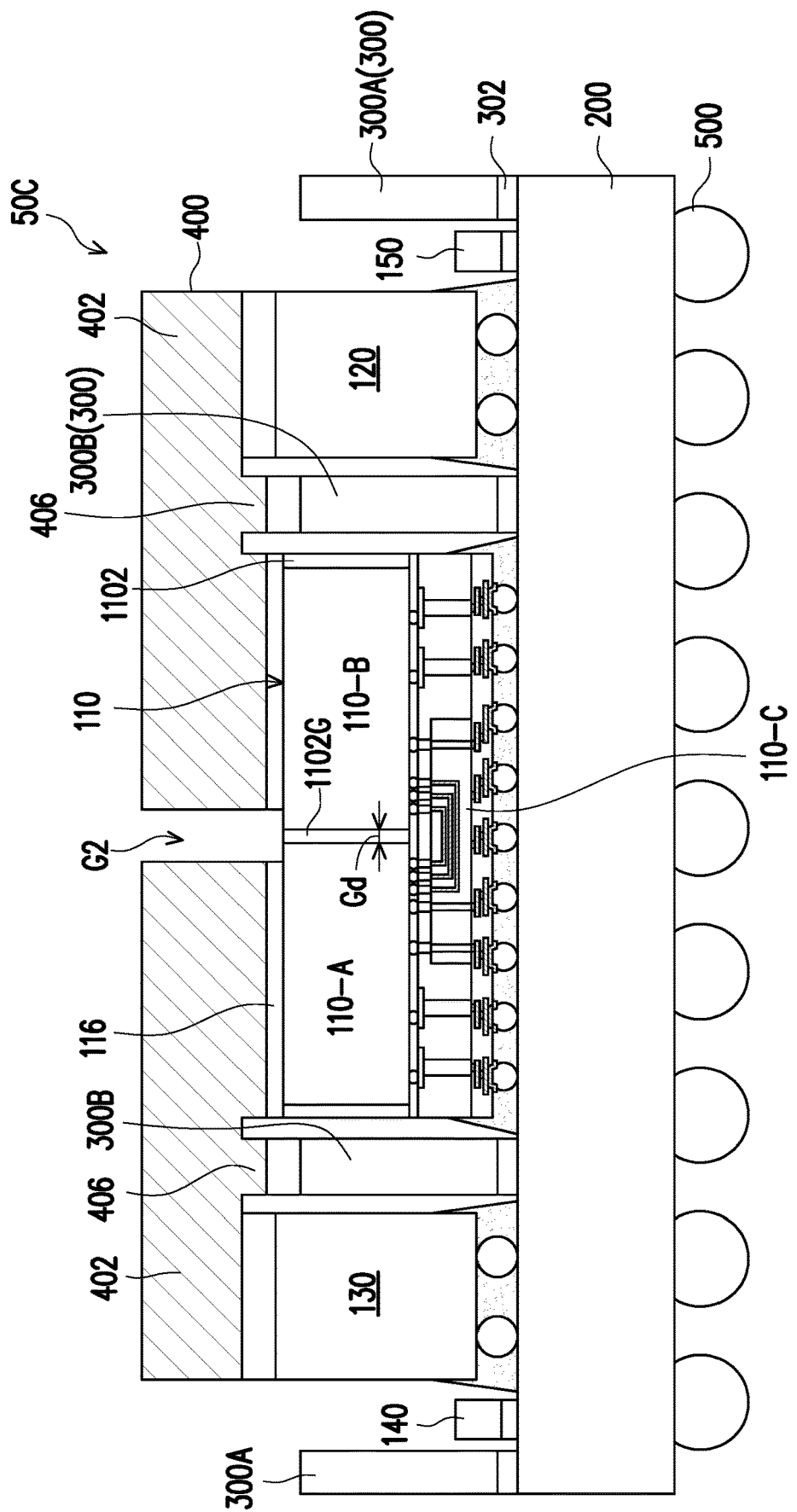

FIG. 9 and FIG. 10 respectively illustrates a schematic top view and a schematic cross-sectional view of a semiconductor package according to some embodiments of the present disclosure.

The package structure 50C shown in FIG. 9 & FIG. 10 is similar to the package structure 50 as shown in FIG. 5 and FIG. 6, except for the design of the heat sink lid 400. The same or similar elements are labeled with the same reference numbers and shall not be described in details again for simplicity. Referring to FIG. 9 and FIG. 10, a heat sink lid 400 is provided over the dies 110, 120, 130 and disposed on the beam portions of the frame structure 300. In some embodiments, the provided heat sink lid 400 is of a size smaller than the size of the circuit substrate 200. That is, the spreading span of the heat sink lid 400 is smaller than the area of the circuit substrate 200. In some embodiments, for the package structure 50C, the heat sink lid 400 covers at least the distribution span of the dies 110, 120, 130, while portions of the circuit substrate 200, the passive components 140, 150 and the beam portions 300B as well as the ring portion 300A are exposed and not covered by the heat sink lid 400. In embodiments, in FIG. 10, the heat sink lid 400 includes a cap 402 and ridge portions 406. In some embodiments, the cap 402 is disposed over the frame structure 300 and the dies 110, 120, 130 and extends substantially parallel to the circuit substrate 200. In some embodiments, the ridge portions 406 extend in the direction D2 across the cap 402 and are located at locations corresponding to the beam portions 300B of the frame structure 300. In some embodiments, the ridge portions 406 are projected out of the plane defined by the cap 402 and joined with the cap 402 as a whole.

In some embodiments, as seen in FIG. 9, the heat sink lid 400 has a slit G2 extending in the direction D1 through the whole length L1 of the heat sink lid 400. That is, for the package structure 50C, the extending length L2 of the slit G2 of the heat sink lid 400 is substantially equivalent to the full length L1 of the heat sink lid 400, and the slit G2 separates the heat sink lid 400 into two halves. Referring to FIG. 9 and FIG. 10, in some embodiments, the slit G2 extends in the first direction D1 across the beam portions 300B, and the slit G2 exposes the gap Gd between the dies 110-A, 110B and the gaps G3 between the dies 130 and between the dies 120, as well as portions of the beam portions 300B. In FIG. 9 and FIG. 10, in some embodiments, the location of the gap Gd between the dies 110-A, 110B and the locations of the gaps between the dies 130 and between the dies 120 overlap with the location of the slit G2. From FIG. 10 and the top view of FIG. 9, the slit G2 exposes the underlying encapsulant portion 1102G (the first encapsulant 1102 located between the dies 110-A and 110-B).

Figure 11:
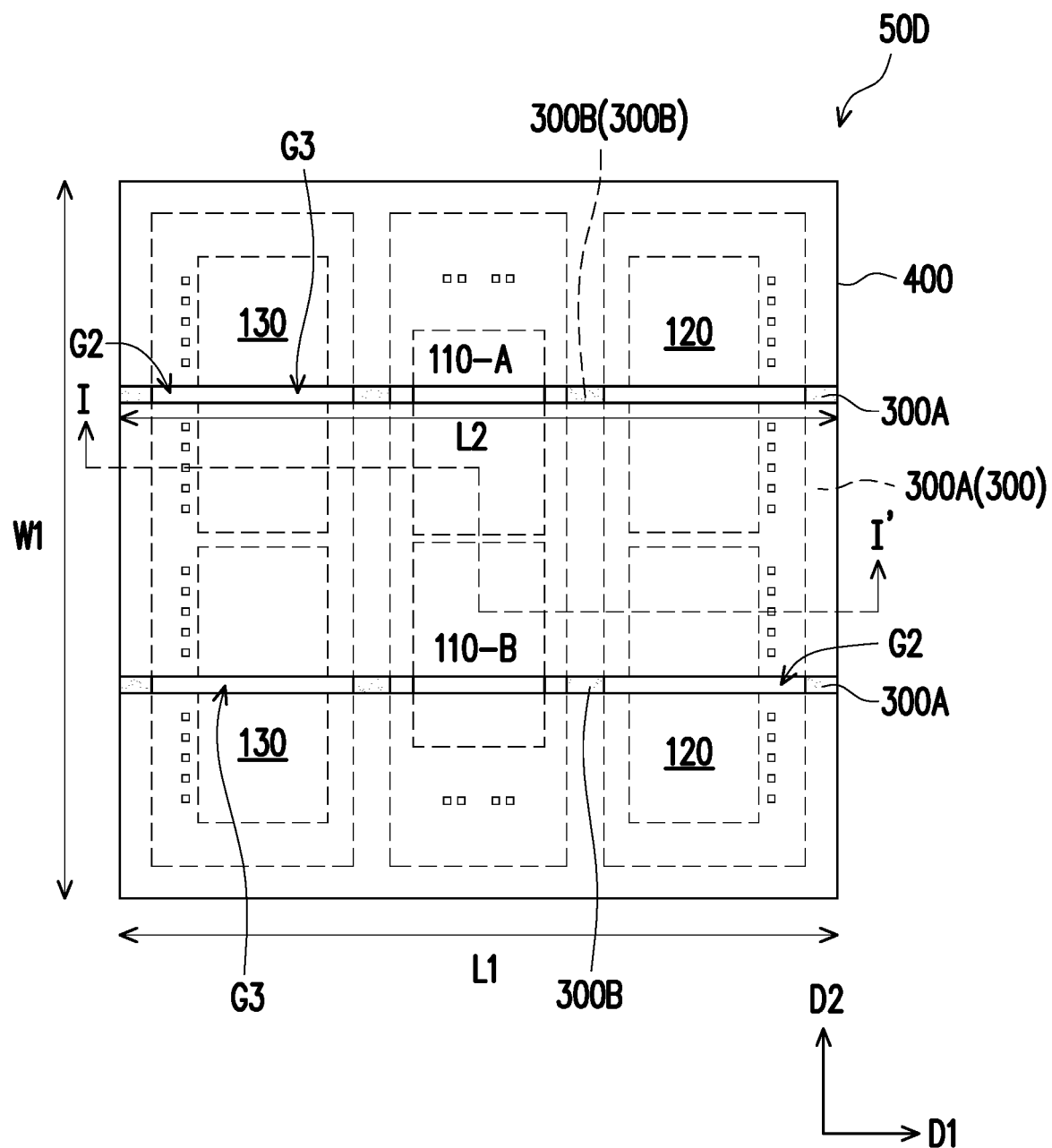
FIG. 11 and FIG. 12 respectively illustrates a schematic top view and a schematic cross-sectional view of a semiconductor package according to some embodiments of the present disclosure.
Figure 12:
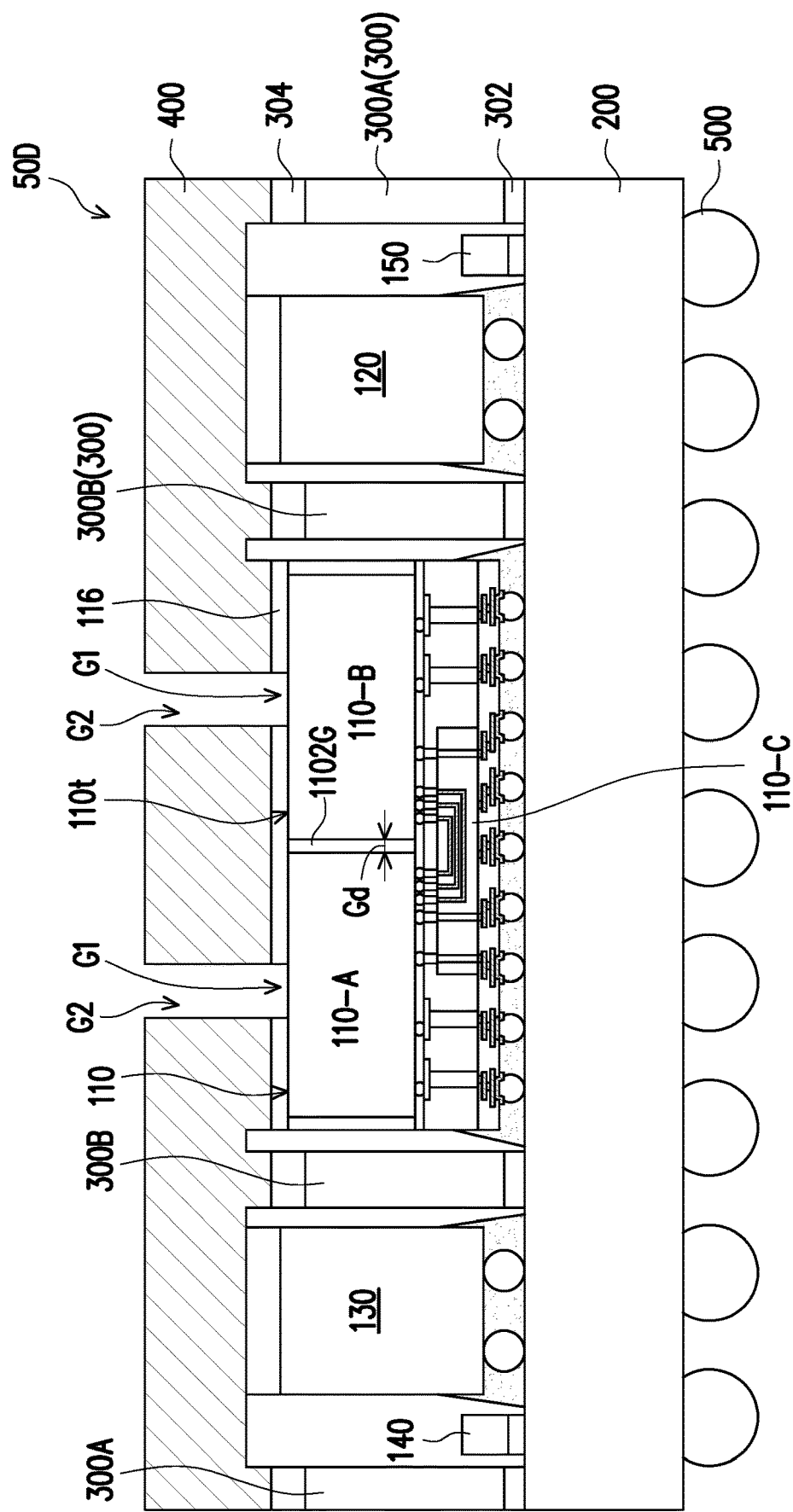

FIG. 11 and FIG. 12 respectively illustrates a schematic top view and a schematic cross-sectional view of a semiconductor package according to some embodiments of the present disclosure.

The package structure 50D shown in FIG. 11 and FIG. 12 is similar to the package structure 50 as shown in FIG. 5 and FIG. 6, except for the design of the heat sink lid 400. The same or similar elements are labeled with the same reference numbers and shall not be described in details again for simplicity. Referring to FIG. 11 and FIG. 12, a heat sink lid 400 is provided over the dies 110, 120, 130 and disposed on the frame structure 300. In some embodiments, the provided heat sink lid 400 is of a size substantially the same as the size of the circuit substrate 200. The spreading span of the heat sink lid 400 is about the same as the area of the circuit substrate 200, and the heat sink lid 400 covers the ring portion 300A and the beam portions 300B of the frame structure 300. In some embodiments, for the package structure 50D in FIG. 11, the heat sink lid 400 has two slits G2 extending through the whole length L1 of the heat sink lid 400. That is, for the package structure 50C, the extending length L2 of the slit G2 of the heat sink lid 400 is substantially equivalent to the full length L1 of the heat sink lid 400, and the slits G2 separate the heat sink lid 400 into three pieces. In some embodiments, the slit G2 has a width W2 substantially equivalent to the width of the gaps G3 between the dies 120 or between the die 130. In one embodiment, the width W2 ranges from about 0.4 mm to about 1.0 mm. In one embodiment, the location of the slit G2 is at around third of the width W1 of the heat sink lid 400.

Referring to FIG. 11 and FIG. 12, in some embodiments, each of the slits G2 extends in the first direction D1 across the ring portion 300A and the beam portions 300B, and each of the slits G2 exposes the gaps G3 between the dies 130 and between the dies 120 as well as portions of the ring portion 300A and the beam portions 300B. In some embodiments, the spreading span of the binding material 116 correspond to the shape of the subsequently applied heat sink lid. In some embodiments, the binding material 116 is formed as three separate pieces located on the top surface 110t of the die 110 with gaps G1 in-between. For example, the slits G2 joining with the gaps G1 expose portions of the dies 110-A and 110-B. In FIG. 11 and FIG. 12, in some embodiments, the locations of the gaps G3 between the dies 130 and the locations of the gaps G3 between the dies 120 vertically overlap with the locations of the slits G2. The locations of the slits G2 may be varied but corresponds to the location of the gaps G3 between the dies 120 and between the dies 130. In embodiments, the slit G2 is long or wide enough to expose the gaps G3 between the dies 120 and the gaps G3 between the dies 130. The locations of the slits G2 may correspond to the locations of the gaps G3 between the dies 130 and between the dies 120. The stress due to CTE mismatch of the materials of the package structure 50D may be reduced through the slits G2, which leads to less cracking or delamination, and better reliability and yield of the package structure.

Talking the package unit of a rectangular shape as an example, the slit(s) G2 extending from the two opposite sides of the frame structure 300 helps to relieve the stress and prevent delamination and cracking of the package structure(s). Based on the simulation results, the stress caused by CTE mismatch between the materials of the package structure may be lowered by up to 50% and thus the cracking risk of the package structure is lowered by up to 50%. Hence, the reliability of the package structure is significantly improved and the yield of the package structure is enhanced.

In some embodiments of the present disclosure, a semiconductor package is provided. The semiconductor package includes a circuit substrate, at least one semiconductor die, a frame structure, a heat sink lid and conductive balls. The circuit substrate has a first surface and a second surface opposite to the first surface. The at least one semiconductor die is disposed on the first surface of the circuit substrate and electrically connected with the circuit substrate. The at least one semiconductor die includes two first dies disposed side by side and the two first dies are separate from each other with a gap between two facing sidewalls of the two first dies. The frame structure is disposed on the first surface of the circuit substrate and surrounding the at least one semiconductor die. The heat sink lid is disposed on the at least one semiconductor die and on the frame structure. The head sink lid has at least one slit that penetrates through the heat sink lid in a thickness direction and exposes the gap between the two facing sidewalls of the two first dies. The conductive balls are disposed on the second surface of the circuit substrate and electrically connected with the at least one semiconductor die through the circuit substrate.

In some embodiments of the present disclosure, a semiconductor package is provided. The semiconductor package includes a circuit substrate, at least one first semiconductor die, at least two second semiconductor dies, a frame structure, a heat sink lid and conductive balls. The circuit substrate has a first surface and a second surface opposite to the first surface. The at least one first semiconductor die is disposed on the first surface of the circuit substrate and electrically connected with the circuit substrate. The at least one first semiconductor die includes two first dies disposed side by side and an encapsulant laterally wrapping around the two first dies, and the two first dies are separate from each other with a portion of the encapsulant filled between two facing sidewalls of the two first dies. The at least two second semiconductor dies are disposed on the first surface of the circuit substrate, beside the at least one first semiconductor die and electrically connected with the circuit substrate. The at least two second semiconductor dies are disposed side by side and spaced apart from each other with a gap there-between. The frame structure is disposed on the first surface of the circuit substrate and enclosing the at least one first semiconductor die and the at least two second semiconductor dies. The heat sink lid is disposed on the at least one first semiconductor die, on the at least two second semiconductor dies and on the frame structure. An open slit of the head sink lid exposes the portion of the encapsulant filled between the two facing sidewalls of the two first dies and exposes the gap between the at least two second semiconductor dies. The conductive balls are disposed on the second surface of the circuit substrate and electrically connected with the at least one semiconductor die through the circuit substrate.

In some embodiments of the present disclosure, a manufacturing method of a semiconductor package is provided. The manufacturing method includes the following steps. A circuit substrate is provided, and semiconductor dies are provided. The semiconductor dies are mounted and bonded to a mounting surface of the circuit substrate. A frame structure is attached to the mounting surface of the circuit substrate, surrounding the semiconductor dies. The heat sink lid is aligned vertically with the frame structure to overlay the heat sink lid with the frame structure. The heat sink lid is attached to the frame structure and on the semiconductor dies. The heat sink lid has a slit exposing a gap between the semiconductor dies.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor package, comprising:
a circuit substrate;
semiconductor dies, disposed on the circuit substrate and electrically connected with the circuit substrate, wherein the semiconductor dies are arranged as a column, and the semiconductor dies are spaced apart with a gap between two most adjacent semiconductor dies;
a beam structure, disposed on the circuit substrate and located beside the column of the semiconductor dies;
a ring wall disposed on the circuit substrate and surrounding the semiconductor dies, wherein the beam structure extends between and connects with opposite sides of the ring wall;
a heat sink lid, disposed over the semiconductor dies and on the beam structure; and
a joining material disposed between the heat sink lid and the semiconductor dies, wherein a through opening that extends through the heat sink lid and the joining material in a thickness direction exposes a portion of the beam structure and the gap between the two most adjacent semiconductor dies.

2. The semiconductor package of claim 1, wherein the through opening extends in a first direction substantially parallel to an extending direction of the gap with a first extending length, and the first extending length is smaller than a length of the heat sink lid in the first direction.

3. The semiconductor package of claim 1, wherein the through opening extends in a first direction substantially parallel to an extending direction of the gap with a first extending length, and the first extending length is substantially equivalent to a length of the heat sink lid in the first direction.

4. The semiconductor package of claim 3, wherein the heat sink lid is divided into two pieces by the through opening.

5. The semiconductor package of claim 1, wherein a spreading span of the heat sink lid is smaller than an area of the circuit substrate.

6. The semiconductor package of claim 1, wherein a spreading span of the heat sink lid is substantially the same as an area of the circuit substrate.

7. The semiconductor package of claim 1, further comprising an adhesive disposed between the ring wall and the circuit substrate and surrounding the semiconductor dies and the beam structure.

8. The semiconductor package of claim 7, wherein the heat sink lid fully covers the ring wall.

9. The semiconductor package of claim 7, wherein the heat sink lid covers the semiconductor dies and partially covers the beam structure without covering the ring wall.

10. A semiconductor package, comprising:
a circuit substrate;
first semiconductor dies, disposed on the circuit substrate and electrically connected with the circuit substrate, wherein the first semiconductor dies are disposed side by side and laterally wrapped by an encapsulant, and the first semiconductor dies are spaced apart with a portion of the encapsulant filled between two most adjacent first semiconductor dies;
second semiconductor dies, disposed on the circuit substrate, located beside the first semiconductor dies and electrically connected with the circuit substrate, wherein the second semiconductor dies are disposed side by side and spaced apart with a gap between two most adjacent second semiconductor dies;
a frame structure, disposed on the circuit substrate, wherein the frame structure includes a ring portion enclosing the first semiconductor dies and the second semiconductor dies, and a beam portion disposed between the first semiconductor dies and the second semiconductor dies, and the beam portion is connected to the ring portion at both ends of the beam portion;
a heat sink lid, disposed over the first semiconductor dies and the second semiconductor dies and on the frame structure; and
a bonding material disposed between the heat sink lid and the first semiconductor dies and the second semiconductor dies,
wherein an open slit that extends through the heat sink lid and the bonding material in a thickness direction exposes the portion of the encapsulant and exposes the gap between the two most adjacent second semiconductor dies.

11. The semiconductor package of claim 10, wherein the frame structure is made of a thermally conductive material.

12. The semiconductor package of claim 11, wherein the open slit extends in a first direction perpendicular to an extending direction of the beam portion, and the open slit exposes a portion of the beam portion and portions of the ring portion.

13. The semiconductor package of claim 11, wherein the open slit extends in a first direction perpendicular to an extending direction of the beam portion, and the open slit exposes a portion of the beam portion.

14. The semiconductor package of claim 11, wherein the heat sink lid includes a cap disposed over the frame structure and extending substantially parallel to the circuit substrate, a ridge portion extending across the cap and protruded from the cap and a rim at a periphery of the cap, a location of the ridge portion corresponds to a location of the beam portion of the frame structure, and a location of the rim corresponds to a location of the ring portion of the frame structure.

15. The semiconductor package of claim 11, wherein the heat sink lid includes a cap disposed over the frame structure and extending substantially parallel to the circuit substrate and a ridge portion extending across the cap and protruded from the cap, and a location of the ridge portion corresponds to a location of the beam portion of the frame structure.

16. The semiconductor package of claim 10, further comprising passive components located on the circuit substrate and located beside the first and second semiconductor dies, wherein the passive components are electrically connected to the circuit substrate.

17. A manufacturing method of a semiconductor package, comprising:
providing a circuit substrate;
mounting semiconductor dies on the circuit substrate, wherein the semiconductor dies are arranged as a column;
bonding the semiconductor dies to the circuit substrate, wherein the semiconductor dies are spaced apart with a gap between two most adjacent semiconductor dies;
attaching a beam structure to the circuit substrate beside the column of the semiconductor dies;
attaching a ring wall on the circuit substrate and surrounding the semiconductor dies, wherein the beam structure extends between and connects with opposite sides of the ring wall;
applying a joining material onto the semiconductor dies without covering the gap; and
attaching a heat sink lid on the joining material and the semiconductor dies and on the beam structure without covering the gap, wherein a through opening extending through the heat sink lid and the joining material in a thickness direction is formed exposing a portion of the beam portion and the gap.

18. The manufacturing method of claim 17, further comprising laterally wrapping the semiconductor dies with an encapsulant that fills up the gap.

19. The manufacturing method of claim 17, further comprising applying an adhesive between the ring wall and the circuit substrate before attaching a ring wall on the circuit substrate surrounding the semiconductor dies and the beam structure.

20. The manufacturing method of claim 17, further comprising mounting passive components on the circuit substrate and beside the semiconductor dies.

* * * * *